United States Patent [19]
Lee et al.

[11] Patent Number: 5,429,791
[45] Date of Patent: Jul. 4, 1995

[54] SILVER-HIGH TEMPERATURE SUPERCONDUCTOR COMPOSITE MATERIAL MANUFACTURED BASED ON POWDER METHOD, AND MANUFACTURING METHOD THEREFOR

[75] Inventors: Hee-Gyun Lee; Seon-Chil Kweon; Dong-Yeon Won; Gye-Won Hong, all of Daejeon-si, Rep. of Korea

[73] Assignees: Korea Atomic Energy Research Institute, Daejeon-si; Korea Electric Power Corporation, Seoul, both of Rep. of Korea

[21] Appl. No.: 264,332
[22] Filed: Jun. 23, 1994

[30] Foreign Application Priority Data

Apr. 25, 1994 [KR] Rep. of Korea ............... 94-8703

[51] Int. Cl.⁶ .................................................. B22F 3/24
[52] U.S. Cl. .................................. 505/433; 419/3; 419/5; 419/8; 419/10; 419/19; 419/21; 419/22; 419/28; 419/38; 419/29
[58] Field of Search .................. 419/4, 3, 5, 8, 10, 419/19, 21, 22, 28, 29, 38; 505/1, 231, 232

[56] References Cited

U.S. PATENT DOCUMENTS

| | | | |
|---|---|---|---|
| 4,594,218 | 6/1986 | Dubots et al. | 419/4 |
| 4,929,596 | 5/1990 | Meyer et al. | 505/1 |
| 4,980,340 | 12/1990 | Anderson et al. | 505/1 |
| 5,145,833 | 9/1992 | Tekeshita et al. | 505/1 |
| 5,204,315 | 4/1993 | Ito et al. | 505/1 |
| 5,347,085 | 9/1994 | Kikuchi et al. | 505/231 |
| 5,374,612 | 12/1994 | Ito et al. | 505/232 |

FOREIGN PATENT DOCUMENTS

| | | | |
|---|---|---|---|
| 0157572 | 6/1989 | Japan | H01R 4/68 |
| 03265523 | 2/1992 | Japan | C01G 29/00 |
| 04224114 | 12/1992 | Japan | C01G 29/00 |
| 04292805 | 3/1993 | Japan | H01B 12/10 |
| 05167108 | 10/1993 | Japan | H01L 39/04 |

Primary Examiner—Donald P. Walsh
Assistant Examiner—John N. Greaves
Attorney, Agent, or Firm—Armstrong, Westerman, Hattori, McLeland & Naughton

[57] ABSTRACT

An article and method of manufacture of a (Bi,Pb)—Sr—Ca—Cu—O superconductor comprising
 calcinating powders of superconductor precursors of PbO, $Bi_2O_3$, $SrCO_3$ or SrO, $CaCO_3$ or CaO in air to obtain a 2223 superconductor lump and second phases;
 crushing the lump into powder;
 molding the powder into a superconductor body;
 disposing the body within silver powder to form a composite;
 molding the composite;
 heat treating the composite to increase the bond strength of the silver powder; and
 working the composite into a useable shape by rolling and drawing while applying intermediate and final heat treatments to obtain a final product.

2 Claims, 2 Drawing Sheets

SILVER-HIGH TEMPERATURE SUPERCONDUCTOR COMPOSITE MATERIAL MANUFACTURED BASED ON POWDER METHOD, AND MANUFACTURING METHOD THEREFOR

FIELD OF THE INVENTION

The present invention relates to a silver-high temperature super conductor wire manufacturing method based on a powder method.

BACKGROUND OF THE INVENTION

The super conductor wire is used on super conductor magnets, power transmission lines, and super conductor electric power system. The super conductivity of the high temperature super conductor can be utilized by using the cheap liquified nitrogen owing to its high threshold transition temperature unlike the conventional super conductors.

However, the high temperature superconductor has a high brittleness, and therefore, cannot be formed into wires. Therefore, it has been proposed that a metal having a large ductility and a large elongation be used so as to form into a composite wire.

Based on this method, Sumitomo Electric Company of Japan was successful in manufacturing a silver/BiSrCaCuO composite super conductor which has a threshold current density characteristics of 40,000 A/cm$^2$ within liquified nitrogen.

Their method was such that a calcinated super conductor powder having a composition of $(Pb,Bi)_2Sr_2Ca_2Cu_3O_{10}$ was filled into a silver tube, and then, was drawn into a wire. Then the wire was subjected to repeated rollings and heat treatments, and thus, a super conductor was obtained in which the thickness and the width were small, and the current density was high, and in which the super conductor grains were oriented in one direction.

However, in this method, first there has to be formed a tube, and, in the process of forming such a tube, foreign materials can be intruded. Further, it is difficult to adjust the density of the super conductor powders, and the shape of the super conductor which is filled into the tube cannot be adjusted.

SUMMARY OF THE INVENTION

The present invention is intended to overcome the above described disadvantages of the conventional techniques.

Therefore it is the object of the present invention to provide a method for manufacturing a silver-high temperature super conductor composite material based on a powder method, in which the above described conventional disadvantages are eliminated.

In achieving the above object, the method for manufacturing a silver-high temperature super conductor composite material according to the present invention includes: (a) instead of a silver tube, a silver powder or a composite silver powder containing MgO is used; and (b) a properly fabricated super conductor body based on a proper pressure is filled into a silver powder based on the process of FIG. 1.

By using a high purity silver powder instead of a silver tube, the intrusion of foreign materials which is likely to occur during the forming of the silver tube can be prevented. Further, first the super conductor powder is fabricated, and then, the silver powder is made to surround the fabricated super conductor body. Therefore in the geometrical aspect, there is no limit to the shape and the dimensions of the fabricated super conductor body. Therefore, the complicatedness of the shape and the current density of the super conductor can be arbitrarily adjusted.

However, in the case where a silver tube is used, a fabricated super conductor body has to be inserted into the silver tube, and therefore, a precision die is required.

However, according to the present invention, even if the super conductor is to be processed into a complicated shape, there will be no problem owing to the large fluidity of the silver powder.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

Figure 1:
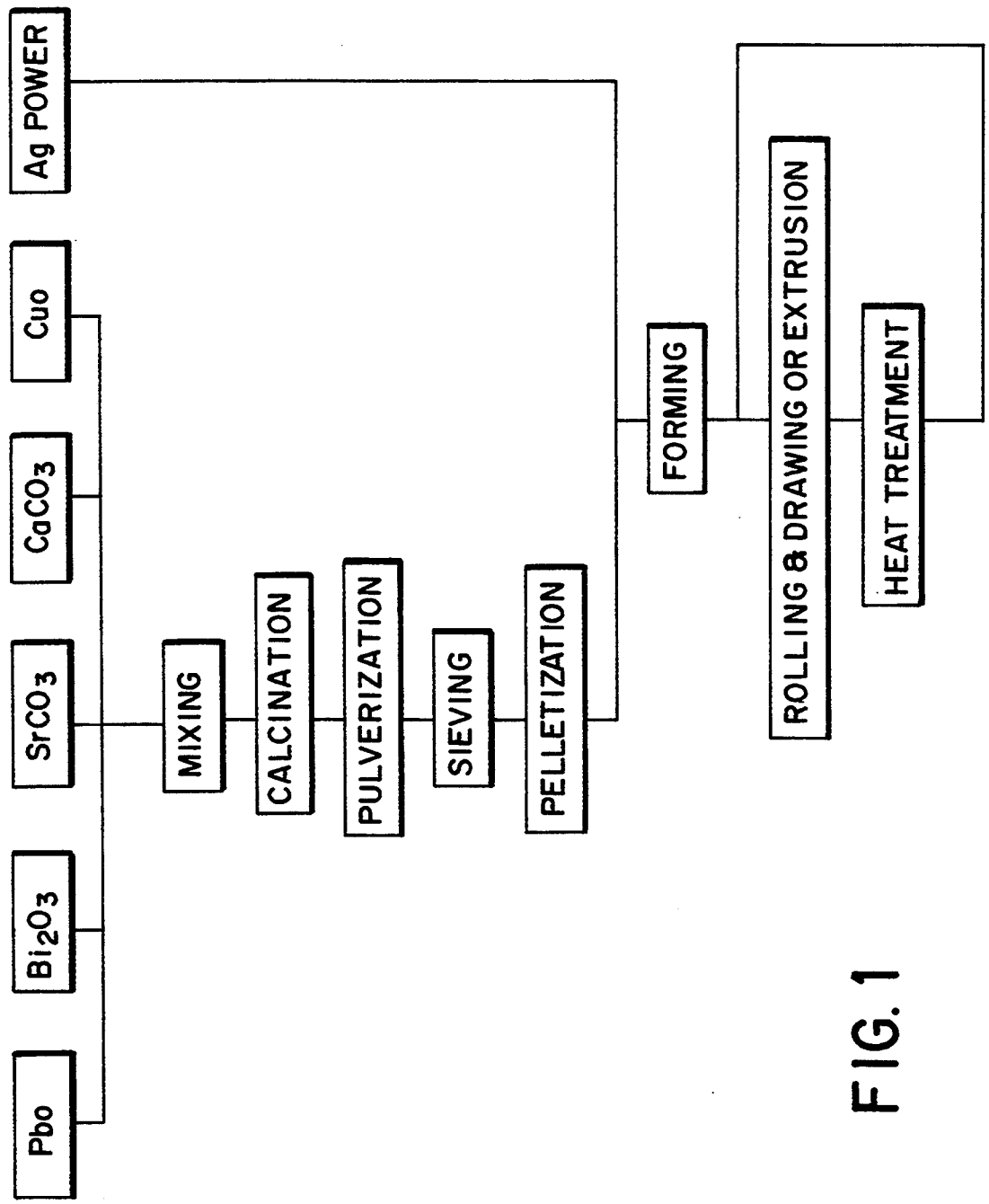
FIG. 1 illustrates the process for forming the high temperature super conductor wire and sheet based on the powder method.

As shown in FIG. 1, powders of initial materials PbO, $Bi_2O_3$, $SrCO_3$ (or SrO), $CaCO_3$ (or CaO) are calcinated in the air at a temperature of 800°–840° C. for 20 hours, thereby obtaining a lump of mixture consisting of a super conductor phase $(Bi,Pb)_2Sr_2Ca_2Cu_3O_8$ and second phases. This lump is crushed into fine particles (powder) of below 200 meshes.

The powder is fabricated by using a mold, this fabricated body is disposed within a silver powder. Then by using a final mold, a composite material consisting of the silver powder and the super conductor body is formed. This composite material is subjected to a heat treatment at a temperature of 750°–860° C. for over 5 hours, thereby improving the bond strength with the silver powder.

The silver-super conductor composite body is formed into a usable shape by applying rolling, extruding and drawing processes.

During the processing, the super conductor body is subjected to heat treatments twice or more at a temperature of 800°–860° C. The finally obtained silver-super conductor composite wire or sheet is subjected to a heat treatment at a temperature of 800°–860° C. for over 12 hours. Thus there is obtained a silver-super conductor composite wire or sheet in which the super conductor grains are oriented in one direction, and in which the threshold current density is very high. This method is applicable not only to the Bi series super conductor which does not react with silver, but also to other ceramic materials.

EXAMPLE 1

Powders of $Bi_2O_3$, PbO, $SrCO_3$, and CuO were uniformly mixed with the ratio of Pb:Bi:Sr:Ca:Cu=0.4:1.6:2:2:3. This mixture was put into a crucible, and was calcinated at a temperature of 820° C. for 24 hours.

This process was repeated three times.

The calcinated material was crushed into fine particles (powder) of below 200 meshes.

This powder was fabricated by using a die and by applying a pressure of 500 kg/cm$^2$. Then this fabricated body was disposed within a silver powder, and then, this composite structure was fabricated by using a die and by applying a pressure of 500 kg/cm$^2$.

The fabricated silver-super conductor composite body was subjected to a heat treatment at a temperature of 820° C. for 24 hours. The heat treatment was carried out slowly by heating by 50° C. per hour.

The heat-treated silver-super conductor composite body was processed to a thickness of 0.2 mm by applying a rolling process. During this process, intermediate heat treatments were carried out three times at a temperature of 820° C. for 24 hours.

The sheet having a thickness of 0.2 mm was subjected to a heat treatment at a temperature of 840° C., and then, a rolling was carried out on it so as to form it into a thickness of 0.1 mm. The rolled sheet was heat-treated at a temperature of 840° C. for 100 hours.

Figure 2:
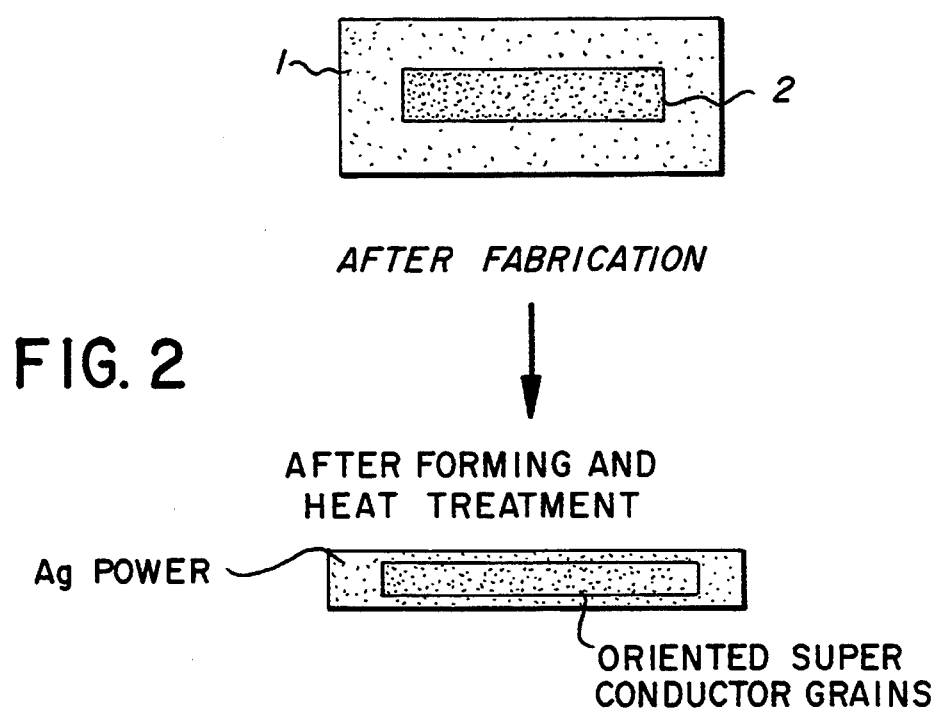
FIG. 2 illustrates the sectional micro-structure of the super conductor wire manufactured according to the method of the present invention.

FIG. 2 is a sectional photograph of the silver-super conductor composite body which is manufactured based on the above described method.

Figure 3:
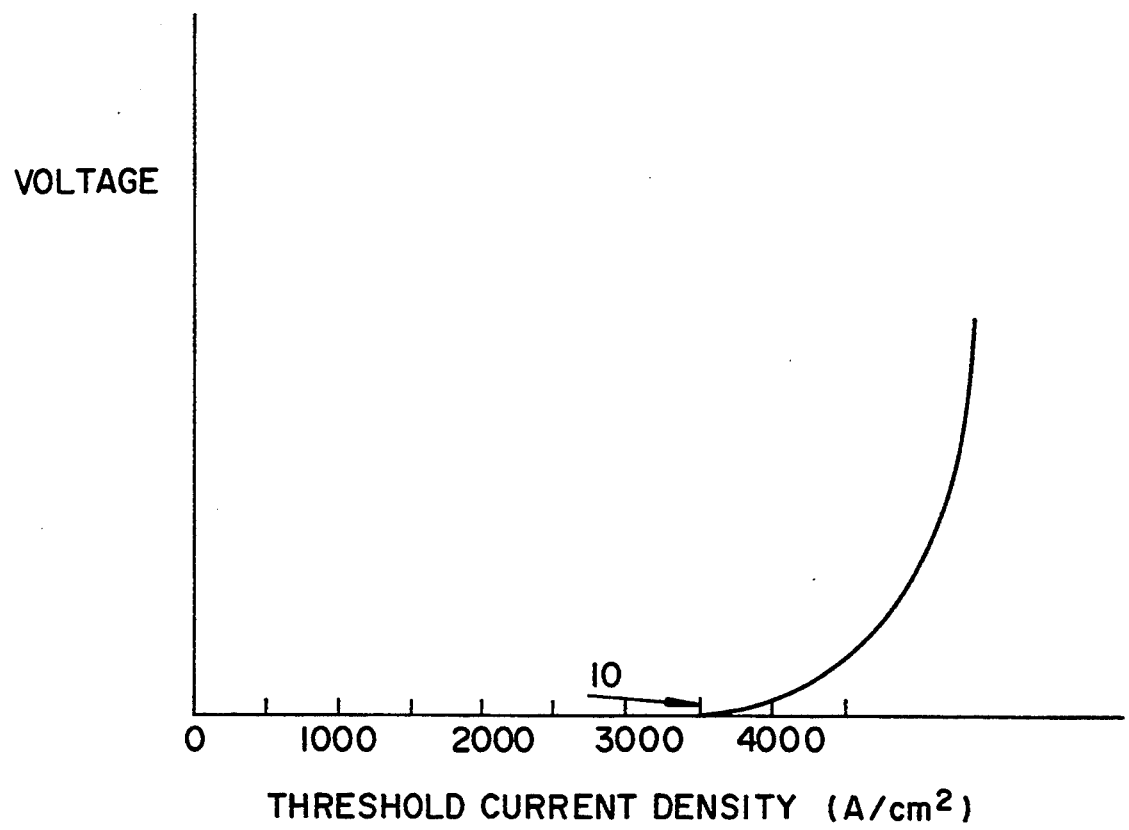
FIG. 3 is a graphical illustration showing the current density versus voltage for the super conductor wire according to the present invention.

FIG. 3 is a graphical illustration showing the current versus voltage at 77° K for the silver-super conductor composite body manufactured based on the above described method, the threshold current density being 3,500 A/cm$^2$.

What is claimed is:

1. A silver-high temperature super conductor composite material manufactured based on the steps of:

calcinating powders of initial materials PbO, Bi$_2$O$_3$, SrCO$_3$ (or SrO), CaCO$_3$ (or CaO) in the air to obtain a lump of mixture consisting of a super conductor phase (Bi,Pb)$_2$Sr$_2$Ca$_2$Cu$_3$O$_8$ and second phases;

crushing said lump into fine particles (powder);

fabricating said powder by using a mold;

disposing said fabricated body within a silver powder;

then by using a final mold, forming a composite material consisting of said silver powder and said super conductor body;

heat-treating said composite material to improve the bond strength with said silver powder; and forming said silver-super conductor composite body into a usable shape by applying rolling, extruding and drawing processes.

2. A method for manufacturing a silver-high temperature super conductor composite material, comprising the steps of:

calcinating powders of initial materials PbO, Bi$_2$O$_3$, SrCO$_3$ (or SrO), CaCO$_3$ (or CaO) in the air to obtain a lump of mixture consisting of a super conductor phase (Bi,Pb)$_2$Sr$_2$Ca$_2$Cu$_3$O$_8$ and second phases;

crushing said lump into fine particles (powder);

fabricating said powder by using a mold into a super conductor body;

disposing said fabricated body within a silver powder;

then by using a final mold, forming a composite material consisting of the silver powder and said super conductor body;

heat-treating said composite material to improve the bond strength with said silver powder;

forming said silver-super conductor composite body into a usable shape by applying rolling and drawing processes; and carrying out intermediate and final heat treatments, thereby obtaining the final product.

* * * * *